(12) United States Patent
Liu et al.

(10) Patent No.: US 9,230,887 B2
(45) Date of Patent: Jan. 5, 2016

(54) MULTIPLE DEPTH VIAS IN AN INTEGRATED CIRCUIT

(71) Applicant: Texas Instruments Incorporated, Dallas, TX (US)

(72) Inventors: Kaiping Liu, Plano, TX (US); Imran Mahmood Khan, Richardson, TX (US); Richard Allen Faust, Dallas, TX (US)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 0 days.

(21) Appl. No.: 14/614,858

(22) Filed: Feb. 5, 2015

(65) Prior Publication Data
US 2015/0170999 A1 Jun. 18, 2015

Related U.S. Application Data

(62) Division of application No. 13/918,430, filed on Jun. 14, 2013, now Pat. No. 8,980,723.

(60) Provisional application No. 61/693,381, filed on Aug. 27, 2012, provisional application No. 61/660,034, filed on Jun. 15, 2012.

(51) Int. Cl.
| H01L 29/00 | (2006.01) |
|---|---|
| H01L 23/48 | (2006.01) |
| H01L 21/48 | (2006.01) |
| H01L 23/522 | (2006.01) |
| H01L 23/532 | (2006.01) |
| H01L 21/768 | (2006.01) |
| H01L 23/50 | (2006.01) |
| H01L 49/02 | (2006.01) |

(52) U.S. Cl.
CPC ............ *H01L 23/481* (2013.01); *H01L 21/486* (2013.01); *H01L 21/76816* (2013.01); *H01L 21/76832* (2013.01); *H01L 21/76834* (2013.01); *H01L 23/50* (2013.01); *H01L 23/5223* (2013.01); *H01L 23/5228* (2013.01); *H01L 23/5329* (2013.01); *H01L 23/53295* (2013.01); *H01L 28/20* (2013.01); *H01L 28/60* (2013.01); *H01L 2924/0002* (2013.01)

(58) Field of Classification Search
CPC ........ H01L 28/40; H01L 28/60; H01L 23/481
USPC ................... 257/532, 774; 438/393
See application file for complete search history.

(56) References Cited

U.S. PATENT DOCUMENTS

| 2005/0062130 A1* | 3/2005 | Ciancio et al. ................. 257/532 |
| 2005/0112836 A1 | 5/2005 | Kim et al. |
| 2006/0281300 A1 | 12/2006 | Yaegashi |
| 2007/0190670 A1* | 8/2007 | Forest ................................ 438/3 |

* cited by examiner

*Primary Examiner* — Theresa T. Doan
(74) *Attorney, Agent, or Firm* — Jacqueline J. Garner; Frank D. Cimino

(57) ABSTRACT

An integrated circuit with vias with different depths stopping on etch stop layers with different thicknesses. A method of simultaneously etching vias with different depths without causing etch damage to the material being contacted by the vias.

3 Claims, 7 Drawing Sheets

MULTIPLE DEPTH VIAS IN AN INTEGRATED CIRCUIT

CROSS REFERENCE TO RELATED APPLICATIONS

This application is a divisional of U.S. Nonprovisional patent application Ser. No. 13/918,430, filed Jun. 14, 2013, and claims the priority of U.S. provisional application Ser. No. 61/693,381, filed Aug. 27, 2012 and U.S. provisional application Ser. No. 61/660,034, filed Jun. 15, 2012. The following co-pending patent application is related to and hereby incorporates by reference U.S. patent application Ser. No. 13/918,388 (Texas Instruments docket number TI-68922, filed Jun. 14, 2013). With its mention in this section, this patent application is not admitted to be prior art with respect to the present invention, the contents of which are herein incorporated by reference in its entirety.

FIELD OF THE INVENTION

This invention relates to the field of integrated circuits. More particularly, this invention relates to etching of vias with different depths.

BACKGROUND OF THE INVENTION

Metal-insulator-metal (MIM) capacitors are well known. They are typically formed within the interconnect layers of an integrated circuit by depositing a metallic bottom plate, depositing a capacitor dielectric and then depositing, patterning and etching a metallic top plate. Typically to save cost and processing steps the top of bottom plate of the MIM capacitor may be formed using one of the layers of interconnect. For high precision MIM capacitors, however, the top and bottom plates are typically formed using separate metallic layers such as TaN and are not formed using interconnect material.

In a typical process flow for integrating a precision MIM capacitor into an integrated circuit manufacturing flow may add two to three additional via patterning etching steps to accommodate the difference in via depths to underlying interconnect level, to the capacitor bottom plate, and to the via top plate. Typically if one via pattern and etch is used to save cost, a significant yield loss occurs due to etch damage. For example, the via to the capacitor top plate is shallow compared to the to the underlying interconnect. Significant damage to the top plate resulting in yield loss may occur during the time when the top capacitor plate via is open while the bottom plate and interconnect vias are still being etched. Similarly damage to the capacitor bottom plate resulting in yield loss may occur during the time when the bottom capacitor plate via is open while the interconnect via is still being etched.

Embedded metal resistors formed from such material as SiCr are typically less than 50 nm thick. Vias to the resistor heads are typically significantly shallower than the vias to the underlying interconnect. Damage to the resistor heads caused during via overetch when a single via pattern and etch is attempted results in yield loss. To prevent yield loss, typical manufacturing flows with embedded resistors use two via patterns and etching steps or add processing steps to form via landing pads on the resistor heads.

SUMMARY OF THE INVENTION

The following presents a simplified summary in order to provide a basic understanding of one or more aspects of the invention. This summary is not an extensive overview of the invention, and is neither intended to identify key or critical elements of the invention, nor to delineate the scope thereof. Rather, the primary purpose of the summary is to present some concepts of the invention in a simplified form as a prelude to a more detailed description that is presented later.

An integrated circuit structure which enables the formation of multiple depth vias with high yield using a single via pattern and etching steps. A high yield single via pattern and etch process for simultaneously forming multiple depth vias.

DETAILED DESCRIPTION

Figure 1A:
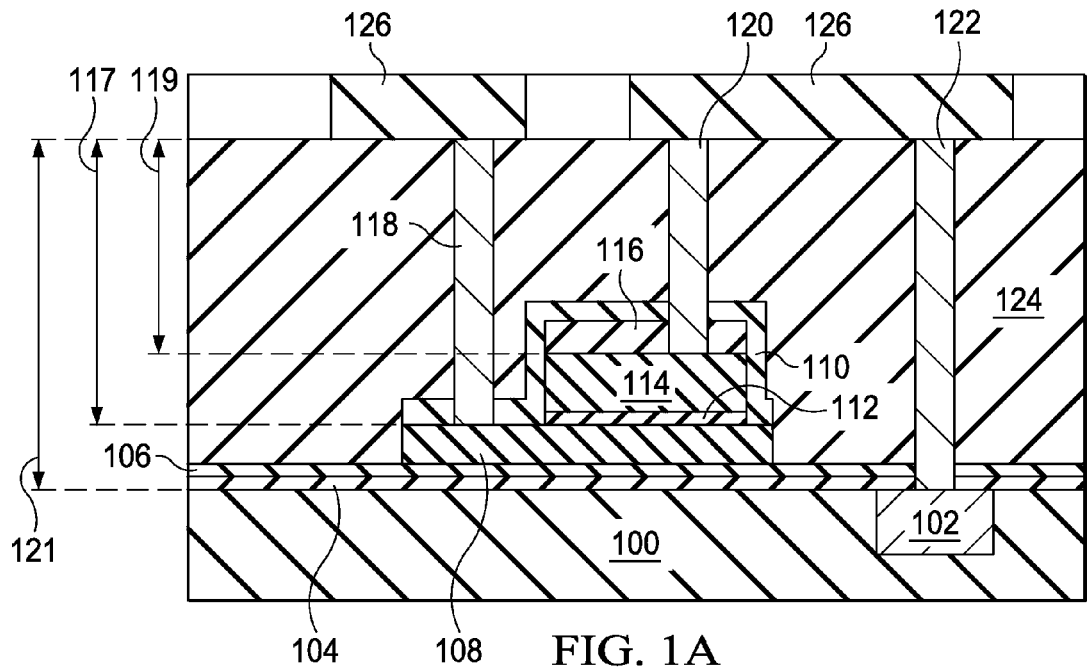
FIG. 1A through FIG. 1C are illustrations of a MIM capacitor structure formed according to embodiments.

The present invention is described with reference to the attached figures, wherein like reference numerals are used throughout the figures to designate similar or equivalent elements. The figures are not drawn to scale and they are provided merely to illustrate the invention. Several aspects of the invention are described below with reference to example applications for illustration. It should be understood that numerous specific details, relationships, and methods are set forth to provide an understanding of the invention. One skilled in the relevant art, however, will readily recognize that the invention can be practiced without one or more of the specific details or with other methods. In other instances, well-known structures or operations are not shown in detail to avoid obscuring the invention. The present invention is not limited by the illustrated ordering of acts or events, as some acts may occur in different orders and/or concurrently with other acts or events. Furthermore, not all illustrated acts or events are required to implement a methodology in accordance with the present invention.

Embodiments illustrating structures and methods for simultaneously forming vias with different depths with high yield using a single via patterning and single via etching step are described. Different thicknesses of an etch stop layer are formed over underlying structures to which the different depth vias are to make contact. By adjusting the etch stop thicknesses, the shallowest via can be opened at about the same time as the deepest via. Opening the different depth vias at about the same time avoids the damage that may occur when one via is open to the etch during the time a deeper via is etching and may significantly improve yield. The need for additional via patterning and etching steps to accommodate the different depth vias is avoided significantly improving cost.

FIG. 1A shows an integrated circuit structure with a high precision MIM capacitor formed according to an embodiment. The MIM capacitor consists of a bottom capacitor plate 108, a capacitor dielectric 112, and a capacitor top plate 114. Etch stop layer 110 of a first thickness is formed on the capacitor bottom plate 108 and an etch stop layer of a second thickness which consists of etch stop layer 116 plus etch stop layer 110 is formed on the capacitor top plate 114. The thickness of the etch stop layer 110 on the bottom capacitor plate 108 and the thickness of the etch stop layer 116 on the capacitor top plate 14 may be controlled independently. The etch rate of the etch stop layers in an oxide plasma etch is significantly slower than the etch rate of the intermetal or interlevel dielectric (ILD) layer 124. Using this difference in etch rates, the thickness of the etch stop layers may be adjusted so that the shallow via 120 to the top capacitor plate 114, the intermediate depth via 118 to the capacitor bottom plate 108, and the deep via 12 to the underlying interconnect 102 all open at approximately the same time. This avoids damage that may occur when an open shallow via is exposed to plasma etch for an extended time while deeper vias are still being etched. Vias 118, 120, and 122 may then be filled with a conductive material such as copper or tungsten to connect the capacitor bottom plate 108 and the capacitor top plate 114 to an overlying layer of interconnect 126. Substrate 100 may be an integrated circuit with one or more levels of interconnect. Interconnect 102 may be a first metal interconnect level or may be a higher level of interconnect. Layer 104 is an etch stop layer and layer 106 is an interlevel dielectric (ILD) layer underlying the capacitor.

Figure 1B:
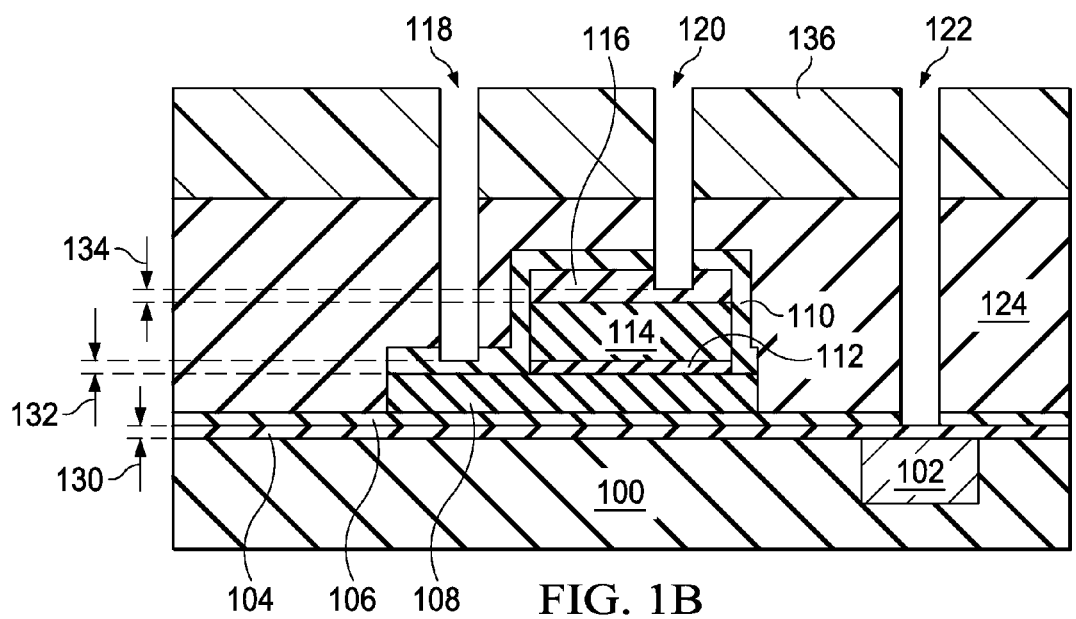

FIG. 1B shows an integrated circuit with a precision MIM capacitor with vias partially etched according to an embodiment. Vias are typically etched using a two step plasma etch. The first step ILD etch is typically an oxide etch which etches the ILD layer 124 at a rate that is significantly faster than it etches an etch stop layer 110 and 116. The second step etch stop layer etch is typically a nitride etch. As shown in FIG. 1B the thickness of the etch stop layer 110 over the bottom plate 108 is adjusted so that after the first step oxide etch the remaining etch stop layer thickness 132 is about the same as the etch stop layer 104 thickness 130 over the underlying interconnect 102. Likewise the thickness of the etch stop layer 116 plus 110 over the capacitor top plate 114 is adjusted so that the remaining etch stop layer thickness 134 is also approximately equal to etch stop layer 104 thicknesses 130 over the interconnect 102.

The additional etch stop layer thickness needed to prevent etch damage to the underlying layer depends upon the difference in via depth and may be calculated using the equation $$AT_{ES} = (D_{deep\text{-}via} - D_{shallow\text{-}via})\left(\frac{ER_{ES}}{ER_{IMD}}\right)$$

Where $AT_{ES}$ is the additional etch stop layer thickness 140 or 142 that is needed, $D_{deep\text{-}via}$ is the depth of the deepest via being etched (121 in FIG. 1A) and $D_{shallow\text{-}via}$ is the depth of a shallower via (117 or 119 in FIG. 1) $ER_{ES}$ is the etch rate of the etch stop layers in the plasma ILD via etch, and $ER_{ILD}$ is the etch rate of the ILD layers 106 (ILD1) and 124 (ILD2) in the plasma ILD via etch.

The thickness of etch stop layer 110 needed over the capacitor bottom plate 108, $T_{ES\text{-}BP}$ is $$T_{ES\text{-}BP} = T_{IES} + AT_{ES\text{-}BP}$$

where $AT_{ES\text{-}BP}$ is the additional etch stop layer thickness needed over the capacitor bottom plate, and $T_{IES}$ is the thickness of the etch stop layer 1004 at the bottom of the deepest via 118.

The thickness of the etch stop layer 116 needed over the capacitor top plate 114, $T_{SIN\text{-}TP}$ is $$T_{ES\text{-}TP} = T_{IES} + AT_{ES\text{-}TP} - AT_{ES\text{-}BP}$$

where $AT_{ES\text{-}TP}$ is the additional etch stop layer thickness needed over the capacitor top plate 114.

Figure 1C:
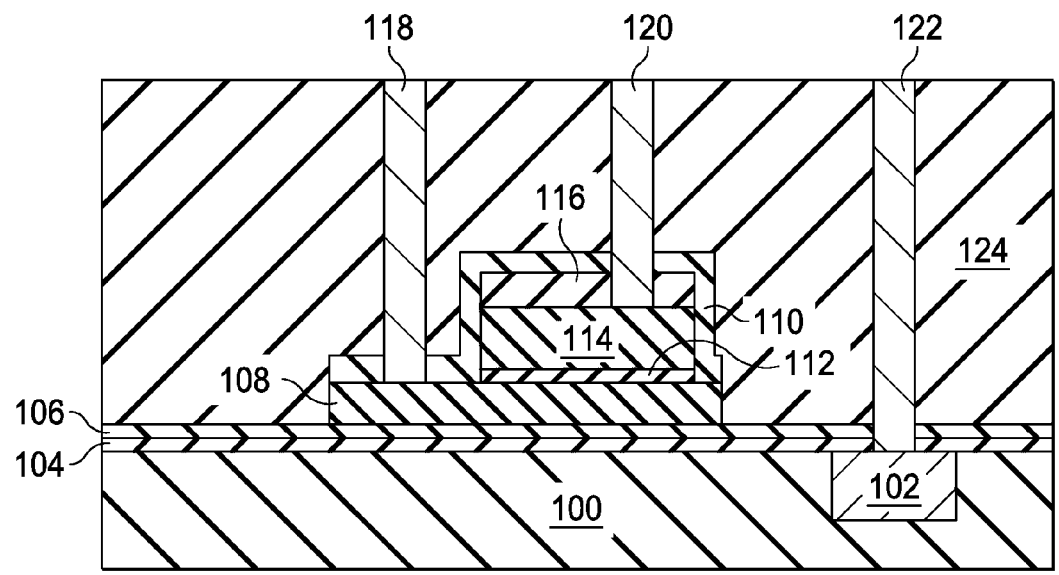

An illustrative example embodiment is given in FIG. 1C. In the example embodiment, etch stop layer 104 is about 70 nm thick, etch stop layer 110 is about 91 nm thick and etch stop layer 116 is about 11 nm thick. ILD1 layer 106 is about 50 nm thick and ILD2 layer 124 is about 1450 nm thick. Capacitor bottom plate 108 is about 70 nm thick, capacitor dielectric layer 112 is about 30 nm thick, and capacitor top plate 114 is about 70 nm thick. Via 118 is about 1381 nm deep, via 120 is about 1178 nm deep, and via 122 is about 1570 nm deep.

For illustration purposes the etch stop layers 104, 110, and 116 are silicon nitride (SiN) with an etch rate, $ER_{SIN}$ of about 40 nm/minute in a plasma oxide via etch. ILD layers 106 (ILD1) and 124 (ILD2) are PETEOS layers with an etch rate of about 400 nm/minute. Using the equations to determine the etch stop layer thickness needed for the via to the capacitor bottom plate $$AT_{ES\text{-}BP} = (1570 \text{ nm} - 1381 \text{ nm})\frac{40 \text{ nm}}{400 \text{ nm}} = 21 \text{ nm}$$

and $$T_{ES\text{-}BP} = 70 \text{ nm} + 21 \text{ nm} = 91 \text{ nm}$$

Also using the equations to determine the etch stop layer thickness needed for the via to capacitor top plate $$AT_{ES\text{-}TP} = (1570 \text{ nm} - 1280 \text{ nm})\frac{40 \text{ nm}}{400 \text{ nm}} = 32 \text{ nm}$$

and $$T_{ES\text{-}TP} = 70 \text{ nm} + 32 \text{ nm} - 91 \text{ nm} = 11 \text{ nm}$$

The time to etch via 122 through ILD layer 106 plus ILD layer 124 stopping on etch stop layer 104 is given by the total ILD thickness of 1450 nm+50 nm=1500 nm divided by the etch rate of 400 nm per minute which equals 3.75 minutes.

The time to etch an ILD thickness of 1178 nm over the capacitor top plate is 1178/400=2.95 minutes so the etching continues for 3.75−2.95=0.8 minutes into the silicon nitride etch stop layer. Since the plasma oxide via etch etches the silicon nitride at a rate of 40 nm per minute, 40×0.8=32 nm of silicon nitride is etched leaving 102−32=70 nm SiN etch stop layer remaining This is about the same thickness as etch stop layer 104 remaining over the interconnect 102.

Similarly the time to etch an ILD thickness of 1380 nm over the capacitor bottom plate is 1289/400=3.22 minutes so the etching continues for 3.75−3.22=0.53 minutes into the silicon nitride. Since the plasma oxide via etch etches the silicon nitride etch stop layer at a rate of 40 nm per minute, 40×0.53=21 nm of silicon nitride is etched leaving 91−21=70 nm SiN etch stop layer remaining. This is about the same thickness as etch stop layer 104 remaining over the interconnect 102.

The example embodiment above shows that when the interconnect via 122 reaches etch stop layer 104 which is about 70 nm thick, the remaining nitride over capacitor bottom plate at the bottom of via 118 is also about 70 nm thick as is the remaining nitride over the capacitor top plate at the bottom of via 120. The plasma etch may then be changed to a SiN plasma etch to remove the remaining nitride from the bottom of vias 118, 120, and 124. Since the remaining SiN is about the same thickness in the bottom of the different depth vias, all vias will open at approximately the same time without damage to the underlying material caused by overetch.

While the embodiment is illustrated using a high precision MIM capacitor, this technique may be used for other applications requiring vias with different depths. In addition, the example embodiment used SiN for an etch stop layer but other etch stop layers such as SiC or aluminum oxide may be used. Other ILD materials such as low-K HDP, HARP, or polyimide may also be used.

Figure 3:
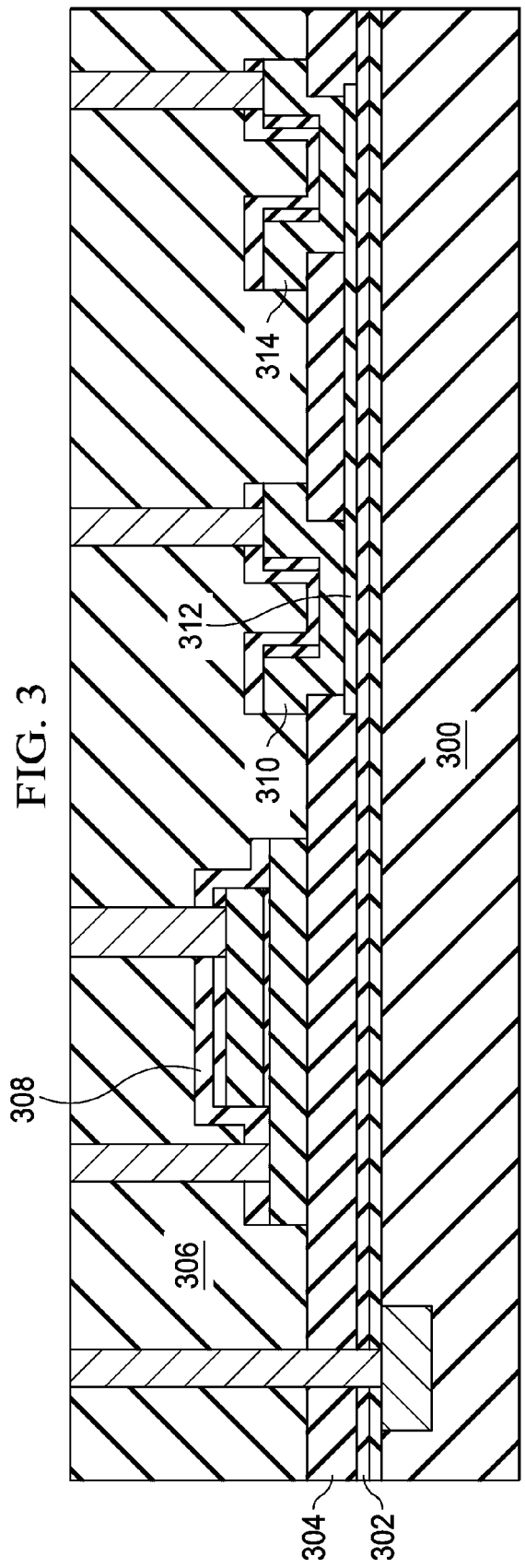
FIG. 3 illustrates an integrated circuit structure formed according to embodiments.

Another example embodiment is shown in FIG. 3. This embodiment shows a MIM capacitor plus and embedded resistor 312 with resistor head pads 310 and 314 formed using the capacitor bottom plate material. {Co-pending patent application is related and hereby incorporated by reference: U.S. patent application Ser. No. 13/918,388, filed simultaneously with this application)}. Via etch stop layer 308 is also formed over the resistor head pads 310 and 314. The embedded resistor adds one additional level of ILD, 304 (ILD-3) so the total ILD thickness becomes the sum of ILD1 302, ILD2 306 and ILD3 304.

Figure 4A:
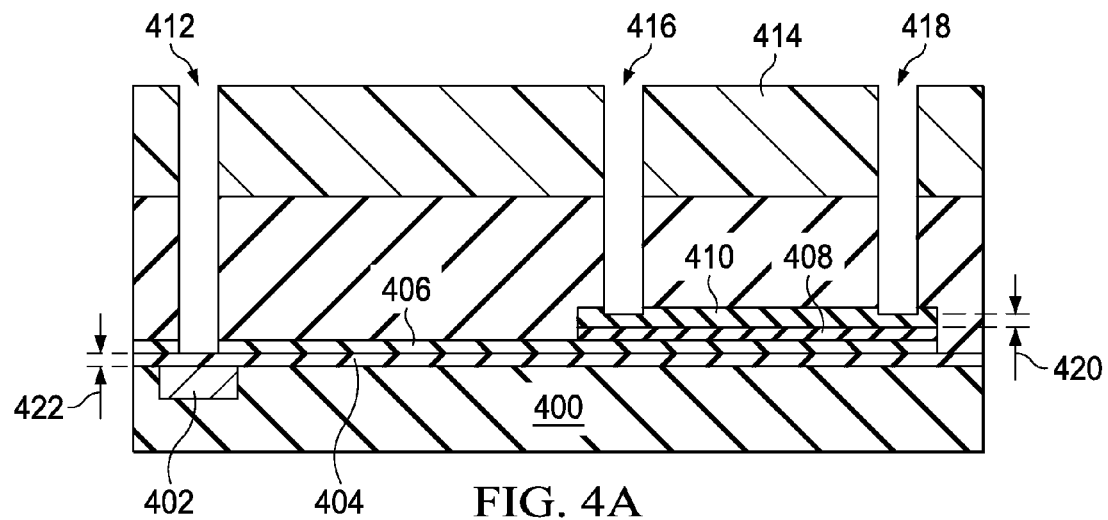
FIG. 4A and 4B are illustrations of a resistor structure formed according to embodiments.
Figure 4B:
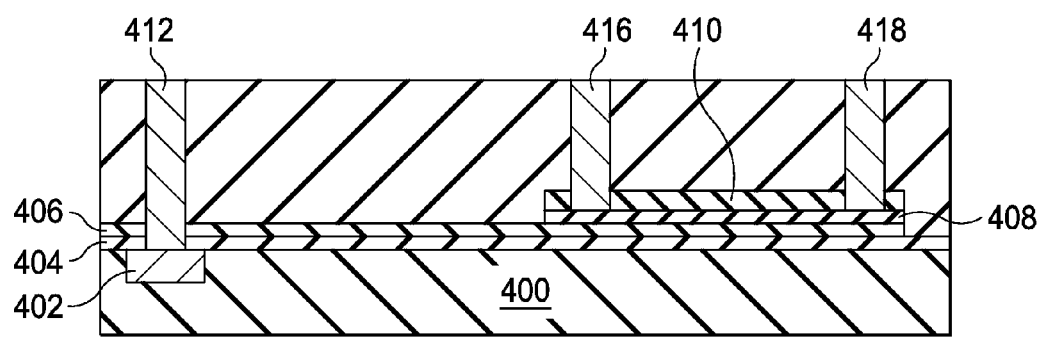

An additional embodiment is described in FIGS. 4A and 4B. FIG. 4A shows an integrated circuit with an embedded resistor 4008. Because resistor material is typically thin it is difficult to stop the via etch on the resistor material without etching damage. Conventional process flows may require additional deposition and patterning steps to form via landing pads on the resistor as shown in FIG. 3. In this embodiment one via pattern and via etching step may be used to simultaneously form contact to the resistor heads 416 and 418 and to the underlying interconnect 402 without damage to the resistor heads caused by via overetch. In this embodiment, the thickness of the etch stop layer 410 on top of the resistor 408 is chosen so that when the interconnect via 412 oxide plasma etch stops on etch stop layer 404, etch stop layer is partially etched leaving a remaining thickness 420 which is approximately equal to the thickness 422 of the etch stop layer 404 over the interconnect 402.

The via etch may then be changed from a plasma oxide etch to a plasma nitride etch to etch through etch stop layer 404 to form contact 412 to the underlying interconnect 402 and also to etch through the remaining etch stop layer 410 to form contacts 416 and 418 to the resistor 408 heads as is shown in FIG. 4B.

An embodiment method for etching vias with different depths without etching damage to underlying layers is illustrated in FIGS. 2A through 2G. A high precision MIM capacitor with a shallow via to the capacitor top plate, an intermediate depth via to the capacitor bottom plate and a deep via to the underlying interconnect is used to illustrate the embodiment method but any process flow that forms vias with different depth may also be used.

Figure 2A:
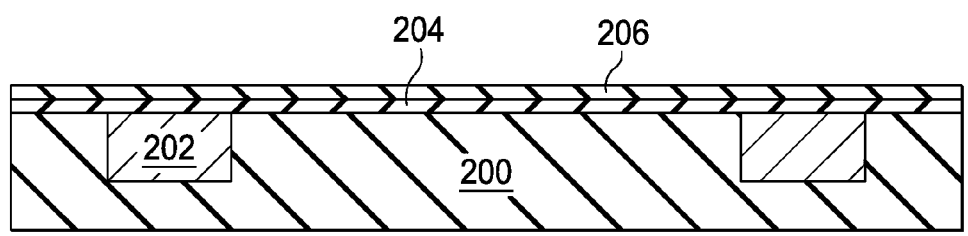
FIGS. 2A through 2G illustrate the major steps in the fabrication of a high precision MIM capacitor formed according to embodiments.

FIG. 2A shows an interconnect level 202 on an integrated circuit 200. Interconnect level may be the first layer of interconnect over the integrated circuit or may be a higher level of interconnect. A first etch stop layer, ES-1, 204, is formed over the interconnect 202 and a first intermetal dielectric layer (ILD-1) 206 is formed on ES-1 204. In an example embodiment the interconnect is copper damascene metal, ES-1 is 70 nm SiN and ILD-1 is 50 nm PETEOS.

Figure 2B:
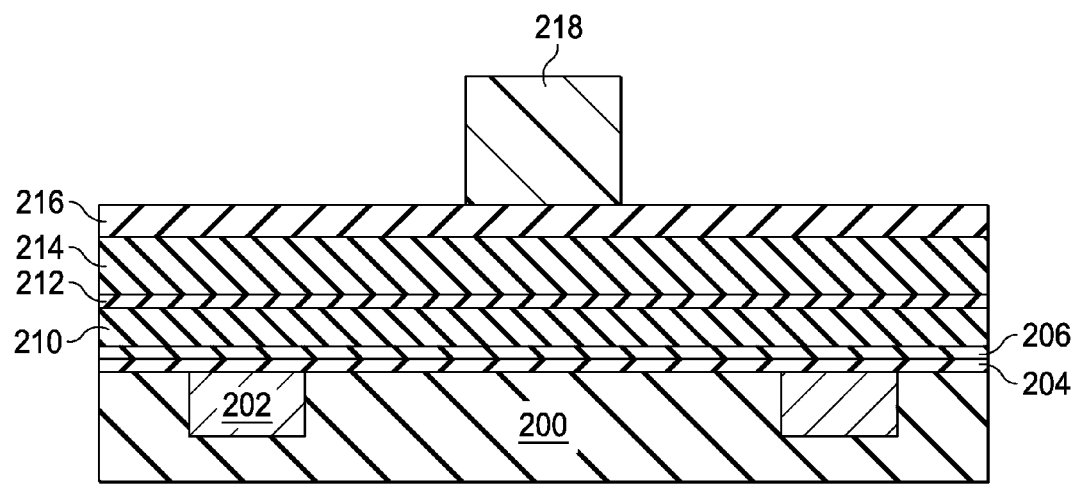

In FIG. 2B a capacitor bottom plate 210, a capacitor dielectric, 212, a capacitor top plate 214, and a second etch stop layer ES-2 is deposited on capacitor top plate layer 214. The thickness of ES-2 is calculated using the equation for $T_{SiN-TP}$. A capacitor top plate photoresist pattern 218 is formed on ES-2. In an example embodiment the capacitor top 214 and bottom 210 plates are 70 nm TiN and the capacitor dielectric 212 is 30 nm SiN. ES-2 is SiN with a thickness $T_{ES-TP}$ calculated to be 11 nm using an ILD etch rate of 400 nm/minute and an ES etch rate of 40 nm/minute.

Figure 2C:
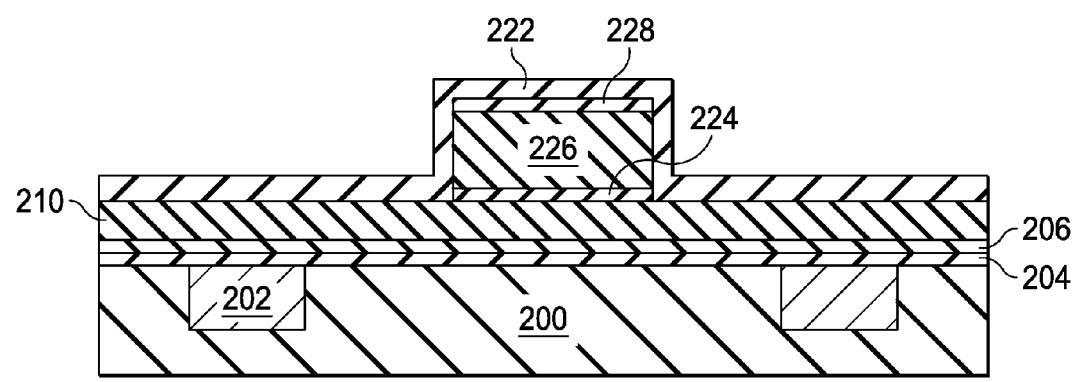

The capacitor top plate 226, ES-2 layer 228, and capacitor dielectric layer 224 are etched in FIG. 2C and top capacitor plate photoresist pattern 218 is removed. A capacitor bottom plate etch stop layer (ES-3) 222 is then deposited. The thickness $T_{ES-BP}$ of ES-3 is calculated to be 91 nm using the above equations with an ILD etch rate of 400 nm/minute and an ES etch rate of 40 nm/minute. ES-3 also deposits over the capacitor top plate 226 so the total etch stop thickness (222 plus 228) over the capacitor top plate becomes 91 nm+11 nm=102 nm.

Figure 2D:
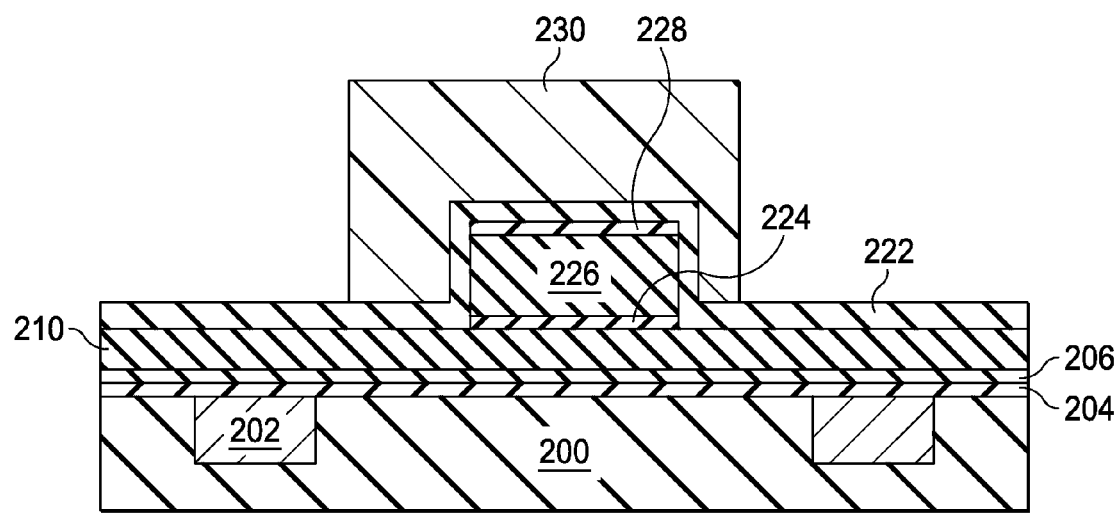

A capacitor bottom plate photoresist pattern 230 is formed in FIG. 2D.

Figure 2E:
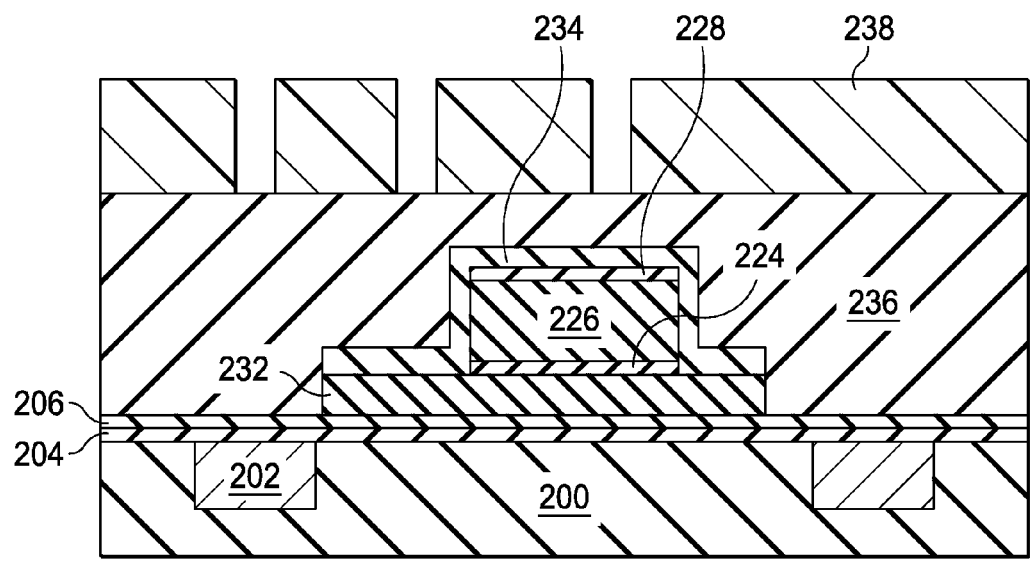

FIG. 2E shows the integrated circuit after ES-3 layer 234 and the capacitor bottom plate 232 are etched and the capacitor bottom plate photoresist pattern 230 is removed. ILD-2 layer 236 is then deposited and a via pattern 238 formed thereon. In an example embodiment, ILD-2 is 1450 nm PETEOS.

Figure 2F:
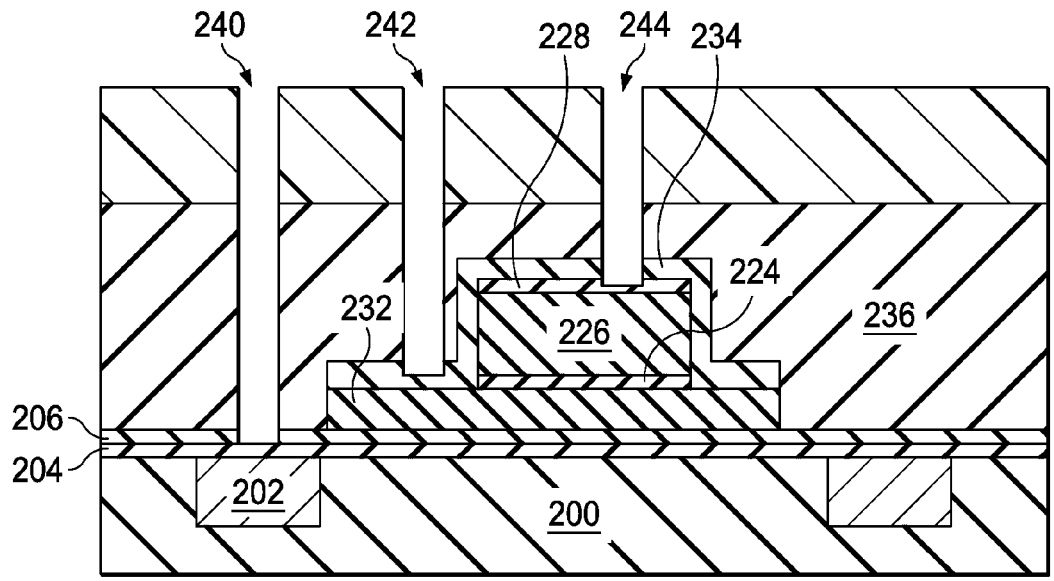

The integrated circuit is shown in FIG. 2F after the ILD portion of the via etch. The via to the underlying interconnect 240 stops on ES-1, the via to the capacitor bottom plate 242 stops in ES-3, and the via to the capacitor top plate 244 stops in ES-2. The remaining thicknesses of ES-2 and ES-3 is approximately equal to the thickness of ES-1. In an example embodiment the ILD portion of the via etch is a plasma oxide etch with about 10:1 selectivity to SiN.

Figure 2G:
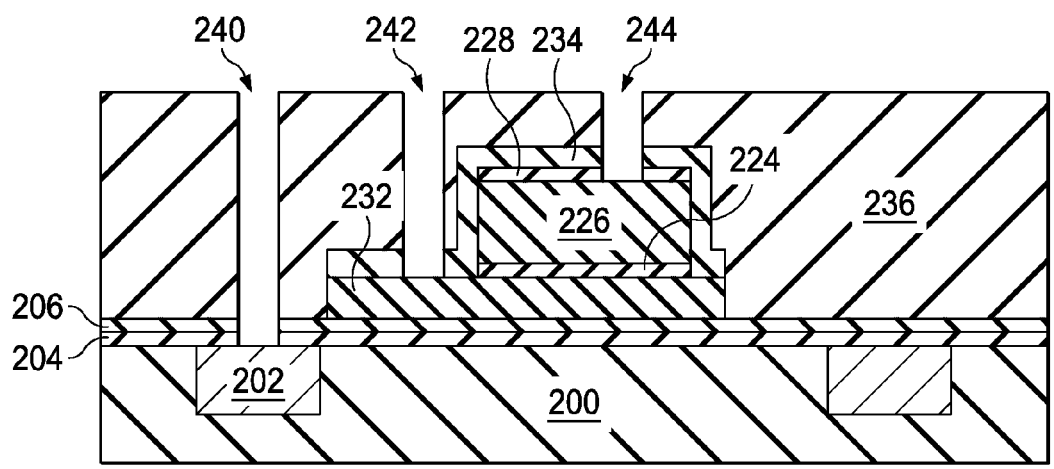

As shown in FIG. 2G, the via etch is then changed from an ILD etch to a ES etch and ES-1, ES-2, and ES-3 layers are etched through to form contact to the interconnect 240, the capacitor top plate 244, and the capacitor bottom plate 242 respectively. In an example embodiment, the ES portion of the via etch is a SiN plasma etch.

While various embodiments of the present invention have been described above, it should be understood that they have been presented by way of example only and not limitation. Numerous changes to the disclosed embodiments can be made in accordance with the disclosure herein without departing from the spirit or scope of the invention. Thus, the breadth and scope of the present invention should not be limited by any of the above described embodiments. Rather, the scope of the invention should be defined in accordance with the following claims and their equivalents.

What is claimed is:

1. An integrated circuit, comprising:
   a first level of interconnect;
   an first etch stop layer with a first thickness on said first level of interconnect;
   a first ILD layer on said first etch stop layer;
   a device formed on said first ILD layer;
   a second etch stop layer with a second thickness approximately equal to said first thickness plus an additional thickness approximately equal to the depth of a deep via minus the depth of a shallow via times the ratio of an etch rate of said etch stop layer to an etch rate of said ILD in a plasma ILD via etch;
   a second ILD layer formed over said device;
   a second level of interconnect formed on said second ILD layer;
   a deep via through said first etch stop layer and through said first ILD layer and through said second ILD layer connecting said second level of interconnect to said first level of interconnect; and
   a shallow via through said second etch stop layer and through said second ILD layer connecting said second level of interconnect to said device.

2. The integrated circuit of claim 1 further comprising:
   an third depth via;
   where said device is a MIM capacitor;

where said second etch stop layer is on a bottom plate of said MIM capacitor;

a third etch stop layer on a top plate of said MIM capacitor with a third thickness approximately equal to said first thickness minus said second thickness plus a thickness approximately equal to the depth of said deep via minus the depth of said third depth via times the ratio of the etch rate of the etch stop layer to the etch rate of the ILD in said plasma ILD via etch; and where said third etch stop layer is on top of a top plate of said MIM capacitor and said third depth via connects said second level of interconnect to said top capacitor plate.

3. The integrated circuit of claim 1 where said device is a resistor, where a first shallow via connects said second level of interconnect to a first head of said resistor and where a second shallow via connects said second level of interconnect to a second head of said resistor.

* * * * *